United States Patent [19]
Moyal

[11] Patent Number: 6,052,010
[45] Date of Patent: Apr. 18, 2000

[54] CIRCUIT, APPARATUS AND METHOD FOR GENERATING SIGNALS PHASE-SEPARATED BY NINETY DEGREES

[75] Inventor: Nathan Y. Moyal, Austin, Tex.

[73] Assignee: Cypress Semiconductor Corp., San Jose, Calif.

[21] Appl. No.: 08/957,725

[22] Filed: Oct. 24, 1997

[51] Int. Cl.[7] .................................................. H03H 11/16
[52] U.S. Cl. ............................................ 327/254; 327/243
[58] Field of Search ..................................... 327/141, 142, 327/143, 144, 146, 147, 148, 149, 150, 152, 153, 155, 156, 157, 158, 159, 161, 163, 232, 238, 254; 331/17; 375/373, 375, 376

[56] References Cited

U.S. PATENT DOCUMENTS

| | | | |
|---|---|---|---|
| 5,566,204 | 10/1996 | Kardontchik et al. | 375/219 |
| 5,610,954 | 3/1997 | Miyashita et al. | 375/375 |
| 5,844,950 | 12/1998 | Aono et al. | 375/346 |
| 5,894,496 | 4/1999 | Jones | 455/126 |
| 5,896,053 | 4/1999 | Prentice | 327/255 |

*Primary Examiner*—My-Trang Nu Ton
*Attorney, Agent, or Firm*—Kevin L. Daffer; Conley, Rose & Tayon

[57] ABSTRACT

An improved clock generation circuit is provided for changing the phase of one signal relative to the phase of another signal. Both signals presented to the clock generation circuit transition at the same frequency. One or both of those signals are delayed by dissimilar amounts to skew the phase difference between the signal pairs and 90°. A phase detector, or logic gate, determines a phase differential between the incoming signals. A charge pump and storage device maintain a voltage level commensurate with that difference. The stored voltage is then used to control a feedback loop coupled from the output of the detector to a current path which traverses a buffer coupled between an input signal and a phase compensated output signal. The current path receives current necessary to change both the rise and fall rates produced by the buffer. According to another embodiment, two feedback loops may be used for a corresponding pair of buffers. A pair of buffers allows phase modification of both incoming signals to corresponding output signals in a more efficient and timely manner.

19 Claims, 3 Drawing Sheets

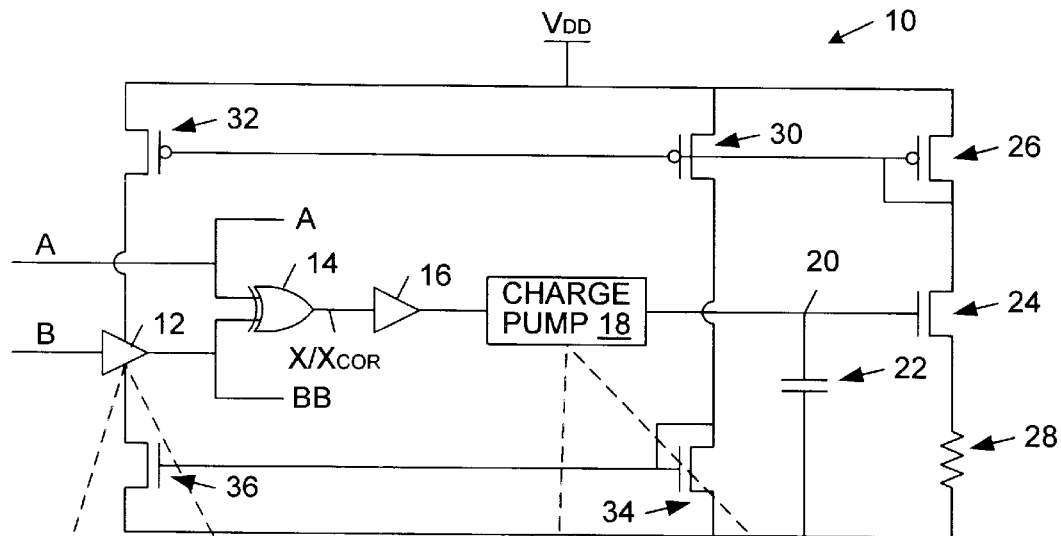
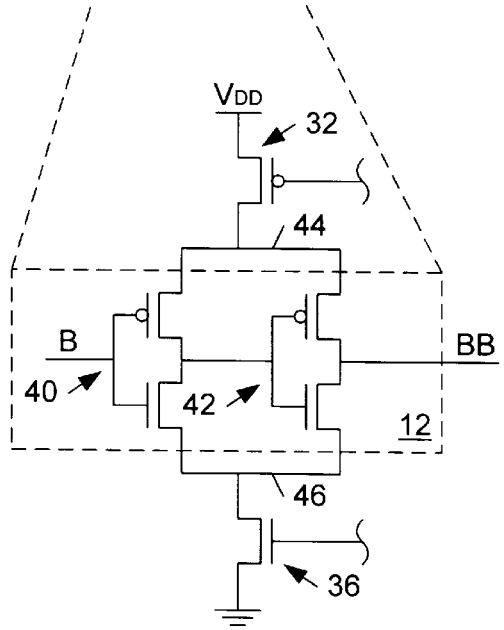
FIG. 2
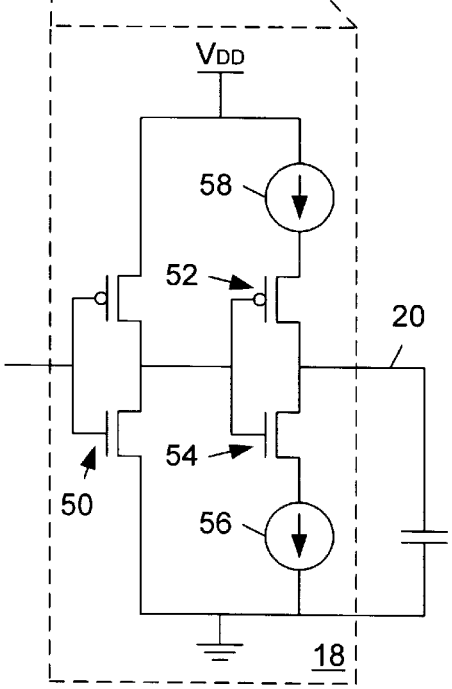
FIG. 3

CIRCUIT, APPARATUS AND METHOD FOR GENERATING SIGNALS PHASE-SEPARATED BY NINETY DEGREES

BACKGROUND OF THE INVENTION

1. Field of the Invention

This invention relates to an electronic system and, more particularly, to a circuit, apparatus and method which can shift a signal within a pair of signals clocked at the same frequency to achieve a ninety degree phase differential between transitions of the signal pair.

2. Description of the Related Art

Demands of modern day processing requires attention be paid to high speed data transmission. Many conventional microprocessors operate at clock speeds in excess of several hundred MHz. Communication across a network or microprocessors can exceed transmission rates of, e.g., 1.0 gigabit per second. Proposed ethernet and fibre channel standards mandate an encoded baud rate in the 1.25 Gb/s range.

To achieve high speed data rates, a clocking signal must be derived to which the data is synchronized. A well designed phase-locked loop ("PLL") can lock to high speed data rates provided fluctuations or "jitter" of data across the transmission media is not excessive. A PLL can therefore recover high speed clocks if properly designed. A crystal oscillator dedicated to the receiving device, and therefore placed outside the transmission media, demonstrates less jitter problems but is not always capable of achieving the higher clocking frequencies.

A clocking multiplier may be used in addition to the PLL and/or crystal oscillator to achieve a stable clocking signal. In a simple form, a clocking multiplier can be realized as a logic gate to which properly defined signals are presented. If the signals are of equal frequency, and transitions of one signal are delayed relative to the other signal, the clocking multiplier can produce an output approximately twice the frequency of the input signals. More importantly, if the phase of one of the clocking input signals is separated by one quarter cycle, or 90 degrees, the clocking multiplier can produce an output signal having a 50% duty cycle at twice the clocking input signal frequency.

It therefore appears advantageous to derive a pair of signals of equal frequency having a 90° phase shift, or skew, from each other. If the signals are thusly formed, not only can a clocking multiplier be achieved, but also other applications can be derived. The clocking multiplier can be used in conjunction with either a crystal oscillator or a PLL output to further enhance the clocking rate at which, for example, the receiving device operates. A clocking multiplier which produces an output signal having a 50% duty cycle is beneficial in high speed environments where the receiving device must sync to rising and falling edges of the clock signal with very little time margin therebetween.

It would be desirous to derive a circuit which can reliably and accurately produce a pair of signals which transition at the same frequency but at a 90° phase difference. The signal pair can be used in multiple applications, and certainly is not limited to that of a clock multiplier. Whatever the application, a circuit which can produce such signals must do so over a broad frequency range and phase differences encountered by clock signals being manipulated to achieve the desired phase difference.

SUMMARY OF THE INVENTION

The problems outlined above are in large part solved by a circuit, apparatus and/or method hereof. The circuit is designed to receive a pair of clocking signals which transition at equal frequencies. Rising and falling edges of one or both signals are skewed in time so that the phase of one signal is offset with the phase of the other signal. The phase offset between signals is consistent for each and every transition, that offset being approximately 90° or one quarter the frequency of the pair of clocking signals.

The present circuit receives the pair of clocking signals which may be skewed more or less than 90° out-of-phase. Thereafter, the circuit detects the phase skew (or phase difference) and either speeds up or delays transitions of one signal relative to the other signal to ultimately achieve and thereafter lock upon a 90° phase differential. Phase difference detection can be performed using a buffer and/or a logic gate, the output of which operably feeds a charge pump. The charge pump accumulates a voltage representative of the phase difference between signals forwarded to the logic gate.

According to one embodiment, the accumulated voltage can produce a current which is then mirrored back to a buffer to which one of the pair of clocking signals is fed. Depending on the quantity of mirrored current forwarded through the buffer, the buffer demonstrates a modifiable drive strength. For example, if the feedback (i.e., mirrored) current is relatively small, then the buffer will minimally drive transitions of one signal of the pair of clocking signals. In other words, small feedback current will produce slow rise and fall rates of one of the clocking signals necessary to delay it ultimately to a 90° difference from transitions of the other clocking signal. Accordingly, the buffer serves not to change the frequency of one signal, but only to consistently change both the transitional edges in time. This includes changing, in time, the rates of both the rising and falling edges. As the phase of one clocking signal is changed at the output of the buffer, the phase detector will detect a phase differential, thereby resulting in a voltage output from the charge pump that is in "equilibrium" when the signal phase is 90° difference. According to one example, equilibrium voltage is roughly a mid-scale voltage between a positive power supply and ground. The mid-scale voltage may cause the drive strength of the buffer to maintain its previous drive characteristics, and therefore maintain equilibrium of the 90° phase differential.

According to another embodiment, the voltage output from the charge pump produces a differential current fed into a constant current source. The differential current produces two current amounts which are mirrored to respective buffers through which respective clocking signals are forwarded. Thus, in the second embodiment, two buffers are used: one of which can skew the phase of one clocking signal and the other of which can skew the phase of the other clocking signal. Manipulating the phase of both clocking signals can skew the two signals to a 90° phase differential with less correction required.

If only one buffer is used, according to the first embodiment, only one clocking signal can be skewed relative to the other clocking signal. If the two clocking signals are initially skewed, nearly 360° apart, the first embodiment may require a significant amount of time necessary to delay the single-buffered signal to be offset from the other non-buffered signal. However, the two-buffered system will only require a maximum of 180° delay of one signal, whereby the combination of both buffers can skew the cumulative pair of signals up to 360° phase correction in possibly less time, but mostly with less correction to that of a single buffer system.

Broadly speaking, the present invention concerns a circuit. The circuit comprises a buffer and a logic gate. The logic gate is coupled to receive a first signal and to further receive a second signal output from the buffer. A storage device is coupled to store an accumulation of voltage output from the charge pump dependent upon phase differences between the first and second signals. A feedback path is operably coupled from the storage device to the buffer for delaying the second signal from the buffer in proportion to the stored voltage.

The present invention yet further concerns a clock generation circuit. The clock generation circuit is used to change the phase at which a first signal transitions relative to a second signal transition, both of which are transitioned at equal frequency. The clock generation circuit comprises a detector for producing a voltage indicative of phase differences between the first signal and the second signal subsequent to the second signal being forwarded through a first buffer of modifiable drive strength. A feedback loop is coupled from the output of the detector to a transistor connected between a power supply and the first buffer. Changes in the voltage produced by the detector modulate the transistor to modify drive strength of the first buffer and cause transitions of the second signal output from the first buffer to be offset approximately 90° relative to transitions of the first signal.

The present invention yet further concerns a method for producing a pre-defined phase difference between transitions of a first clocking signal and a second clocking signal of equal frequency. The method comprises producing a voltage indicative of a phase difference between the first and second signals. A current produced from the voltage is fed through a current path between a buffer and a power supply. Current within the current path is modified, resulting from a change in a phase difference between the first and second signals. Modification of the current causes a change in the rate of rising and falling edges (i.e., transitions) within the first clocking signal output from the buffer to achieve a 90° phase difference from transitions of the second clocking signal.

BRIEF DESCRIPTION OF THE DRAWINGS

Other objects and advantages of the invention will become apparent upon reading the following detailed description and upon reference to the accompanying drawings in which:

FIG. 1 is a circuit diagram of a clock generation circuit, according to a first embodiment, comprising a buffer of modifiable drive strength, a phase difference detector and a charge pump connected to a filter which produces a voltage signal relative to the phase difference between a pair of input signals;

FIG. 2 is a detailed, circuit diagram of the buffer, in exemplary form, used in the clock generation circuit to change the rise and fall rates within one signal of the signal pair if current supplied to the buffer is modified;

FIG. 3 is a detailed, circuit diagram of the charge pump, in exemplary form, used in the clock generation circuit to accumulate a voltage dependent on the phase difference between the pair of signals and to feed that voltage back to the buffer which can then modify the phase difference to a ninety degree differential;

Figure 4:
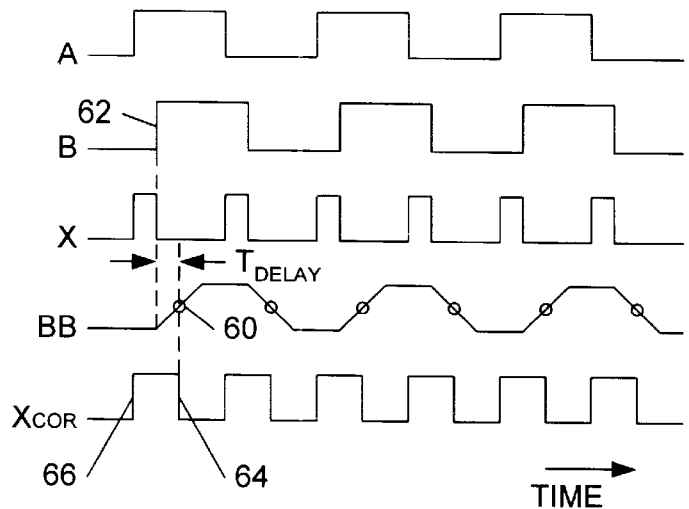
FIG. 4 is a timing diagram of an equal frequency pair of signals before and after which transitions of one signal in the signal pair is shifted to produce a ninety degree phase differential.

While the invention may be modified and have alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning now to the drawings, FIG. 1 illustrates a circuit 10 used to modify phase differences between a pair of incoming clocking signals A and B. Clocking signals A and B are of equal frequency and shifted in phase relative to one another. According to one example, signal B is fed into a buffer 12, the output of which is dispatched to a logic gate 14 along with signal A. According to one example, logic gate 14 is an exclusive OR gate which receives signal A and buffered signal B, and produces a logic 1 whenever the incoming signals are dissimilar in logic value.

The output of logic gate 14 may be fed into another buffer 16, or directly into a charge pump 18. Charge pump 18 serves to accumulate charge upon a node 20 corresponding to relative differences in the logic gate output. Accordingly, charge pump 18, in combination with filter 22, operates as a storage device.

For example, logic gate 14 may produce a predominant amount of logic 0 values relative to logic 1 values, indicative of a relatively low voltage at node 20. Voltage at node 20 is retained by a low-pass filter which, according to one embodiment, is represented as a filter (capacitor) 22 coupled between node 20 and a ground supply. Capacitor 22 serves to store accumulated voltage at node 20 output from charge pump 18.

The accumulated voltage at node 20 may either be fed directly to an n-channel transistor 24 or directly into a p-channel transistor 26. As shown, n-channel transistor 24 receives the accumulated voltage and, depending on that voltage relative to a threshold amount, transistor 24 will transfer current relative to the voltage level. P-channel transistor 26 is shown having its gate coupled to its drain so that whatever current is within resistor 28 is also forwarded through the source-drain path of transistor 26.

Current within transistor 26 is mirrored to p-channel transistor 30 as well as p-channel transistor 32. N-channel transistor 34 receives whatever current is within the source-to-drain path of transistor 30. Since the gate and source terminals of transistor 34 are mutually connected to n-channel transistor 36, current within transistor 34 is mirrored to transistor 36. Thus, if current is present, that current delivered from a source-to-drain path of transistor 32 will equal the current from the drain-to-source path of transistor 36, provided the width/length sizings and performance points of the various transistors are substantially equal.

The significance of transistors 30 through 36 is realized as a feedback path operably coupled from the storage device 22 to buffer 12. The voltage at node 20 will produce a corresponding current through a first current path represented as the source and drain paths of transistors 24 and 26. Current within the first current path is then mirrored to a second current path of transistor 32 and a third current path of transistor 36.

Depending on the magnitude of current within the current paths of transistors 32 and 36, a corresponding delay of signal B (second signal) is achieved. If the current is relatively small, indicative of a relatively low voltage at node 20, then the drive strength of buffer 12 will be minimal. However, if the current is large as a result of a large voltage at node 20, then the drive strength will be large to produce a rapid rise and fall rates of the signal produced from buffer 12.

Buffer 12 is shown in FIG. 1 to skew the rising and falling edges of second signal B relative to first signal A. Output from buffer 12 (i.e., signal BB) is skewed so that the rising and falling edges are at 90° difference from signal A. Accordingly, signal A and signal BB result from FIG. 1 having the presently desired phase difference.

Figure 5:
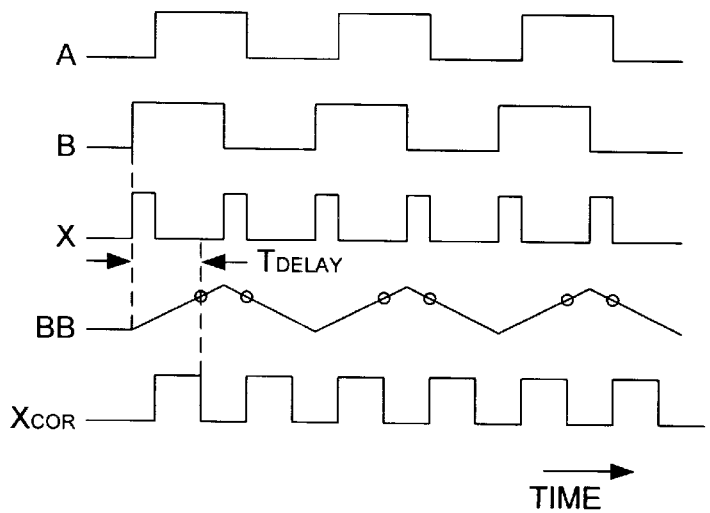
FIG. 5 is a timing diagram of a signal within the signal pair being shifted substantially more than that shown in FIG. 4 to indicate the modifiable drive strength of the buffer.

The mechanism by which voltage is produced at node 20, and the result of that voltage on the rising and falling edges of ensuing signal BB is better illustrated in reference to timing diagrams provided in FIGS. 4 and 5. Details of those timing diagrams and the operation of circuit 10 will, however, be better understood if details of buffer 12 and charge pump 18 are better described.

FIG. 2 illustrates buffer 12, according to one example. Buffer 12 may include an even number of inverters 40 and 42 coupled in parallel between nodes 44 and 46. Inverter 40 receives incoming signal B, and inverter 42 produces a phase shifted outgoing signal BB. Shifting the phase of signal BB relative to signal B is achieved based on the current through transistors 32 and 36. Since the current is mirrored such that transistors 32 and 36 will be conducting at approximately the same magnitude, the amount of current driven by transistors 32 and 36 mandates a quantifiable current through buffer 12. If the current is relatively small, inverters 40 and 42 will not drive the transitions of signal BB at high rise and fall rates. Advantageously, current is mirrored to both transistors 32 and 36 so that both the rise and fall rates are affected. If current is driven only to transistor 32 without being mirrored to transistor 36, then only the rise rate will be affected and not the fall rate. It is necessary to achieve phase skewing so that both the rise and fall rates are equally affected.

FIG. 3 represents one example of charge pump 18. Charge pump 18 may or may not include an inverter 50 depending on whether logic gate 14 (shown in FIG. 1) is an exclusive OR gate or whether it is an exclusive NOR gate. The switching mechanism used by the charge pump is but one example, although not necessarily inclusive of all mechanisms which might be used. Inverter 50 serves to invert the phase detected difference between signal A and signal BB as determined by logic gate 14. The inverted signal may then be used to activate either the p-channel transistor or n-channel transistor 54. If the signal is above a pre-defined amount, the n-channel transistor 54 will transition on, allowing current source 56 to discharge voltage from node 20. Conversely, if the signal is below a pre-defined amount, then transistor 52 will transition on, allowing current source 58 to charge node 20. Accordingly, a low voltage at the input of inverter 50 will produce a discharge of node 20, while a high voltage at the input of inverter 50 will charge node 20. Charging and discharging of node 20 is dependent on the relationship of the signal fed to inverter 50 relative to, e.g., a mid-scale voltage value. Thus, if the output from logic gate 14 indicates a signal having longer logic low values than logic high values, then the input to inverter 50 will be low longer than it is high, producing a discharge of node 20. If the logic high and logic low values are of equal duration, then the voltage produced at node 20 may be, for example, at mid-scale between the positive power supply and ground, during steady state conditions. It is only if the voltage node 20 differs from mid-scale will be current within transistors 32 and 36 (shown in FIG. 1) change. Otherwise, the current will not be modified and the drive strength of buffer 12 will remain the same (i.e., in equilibrium to maintain a 90° phase difference between signal A and signal BB).

Turning to FIGS. 4 and 5, timing diagrams are presented illustrating the operation of the exemplary circuit 10 shown in FIG. 1. FIG. 4 depicts signals A and B being skewed from one another by approximately 45° phase difference. Output from the logic gate is shown as reference numeral "X". Signal X includes logic-high pulses which are shorter in duration than the logic 0 durations for each clock cycle. This results in a discharge of the storage device (i.e., capacitor 22 shown in FIG. 1). Discharging the storage device will reduce the current through transistors 24 and 26 which, in turn, will lessen the mirrored current through transistors 32 and 36. The effect of reducing the current through transistors 32 and 36 will be to reduce the drive strength of buffer 12, to cause slower rising and falling edges of signal BB, as shown in FIG. 4. For example, the first rising edge 60 of signal BB is delayed from the rising edge 62 of signal B by an amount shown as $D_{DELAY}$. The first rising edge 60 is shown having a "trip point" slightly higher in voltage than the logic zero level. The trip point causes transition within the logic gate 14, and is therefore considered to be the new, skewed rising edge of signal BB. Positive-going edge 60 causes transition of logic gate 14 after a threshold is achieved. That trip point produces a negative-going edge 64 approximately 90° delayed from a positive going edge 66. The negative- and positive-going edges 64 and 66 indicate a 50% duty cycle of the corrected output signal from logic gate 14 produced by shifting the phase of signal B to signal BB.

Instead of signal B being delayed 45° from signal A, FIG. 5 illustrates another scenario whereby signal A being delayed 45° from signal B. The uncorrected output from logic gate 14 appears similar to that shown in FIG. 4. However, the amount of delay needed to achieve a 90° differential is substantially larger than that shown in FIG. 4. Specifically, FIG. 5 illustrates the need to delay signal BB approximately 135° from signal B to achieve a phase difference of 90° from signal A. Since, according to the embodiment shown in FIG. 1, signal B can only be delayed, the amount of delay is fairly substantial if signal B is ahead of signal A.

Figure 6:
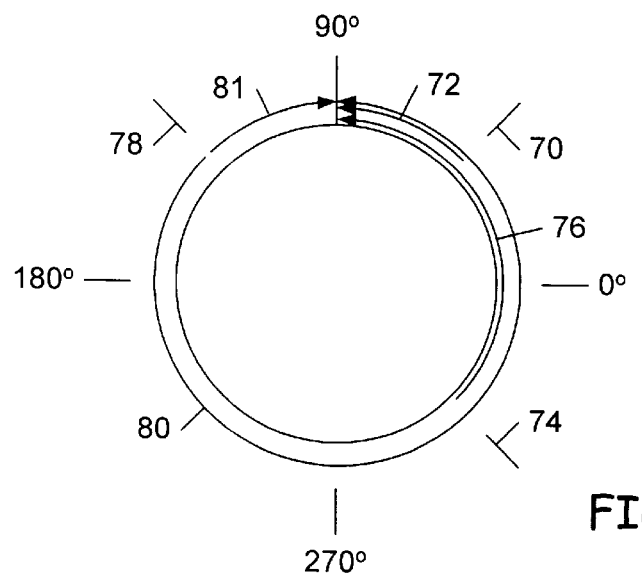
FIG. 6 is phase diagram of a phase requirement between signals of the signal pair before and after phase of one signal is shifted in one direction relative to the other signal to achieve ninety degree phase difference, according to the circuit of FIG. 1.

FIG. 6 illustrates a phase adjustment of phase differences between signal A and signal B as well as phase differences between signal A and signal BB. Before being corrected to signal BB, signal B may be phase skewed approximately 45° from signal A, as shown by radian position 70. As shown in FIGS. 4 and 6, delaying signal B to signal BB will move the difference from radian position 70 to a 90° differential, as shown by arrow 72. Referring to FIGS. 5 and 6, a 135° (or −45°) differential between signals A and B, as shown by radian 74, can be moved to a 90° phase difference when signal BB is delayed, as shown by arrow 76. In both instances, arrows 72 and 76 indicate a delay in signal BB relative to signal A. The counter-clockwise movement 72 and 76 becomes even more substantial if the phase difference becomes almost 360°. FIG. 6 illustrates radian 78, whereby the phase difference is approximately 315°. The amount of delay imputed upon signal B to produce signal BB is rather substantial, as shown by the counter-clockwise vector 80. If, for example, signal B is presently delayed, the transitions of signal B can be increased to speed up signal B to signal BB according to the clockwise vector 81. This, of course, presumes that signal B is previously sufficiently delayed to allow the present circuit to increase transitions necessary to obtain a 90° differential.

FIGS. 1 and 6 illustrate an increase in the downward pumping of voltage at node 20 as the amount of delay in transitions of signal BB increases relative to signal A transitions. It is recognized, however, that a buffer can be utilized on signal A to present a delayed signal AA, in lieu of or in addition to the buffer on signal B. Regardless of where the buffer is placed, the intent is the same: to delay signal transitions of one signal relative to transitions of the other signal. Use of a single buffer to delay one signal is achieved by a relatively simple circuit 10; however, dual buffers and dual feedback paths may achieve a more beneficial compensation mechanism yet at the price of adding complexity to the circuit itself.

Figure 7:
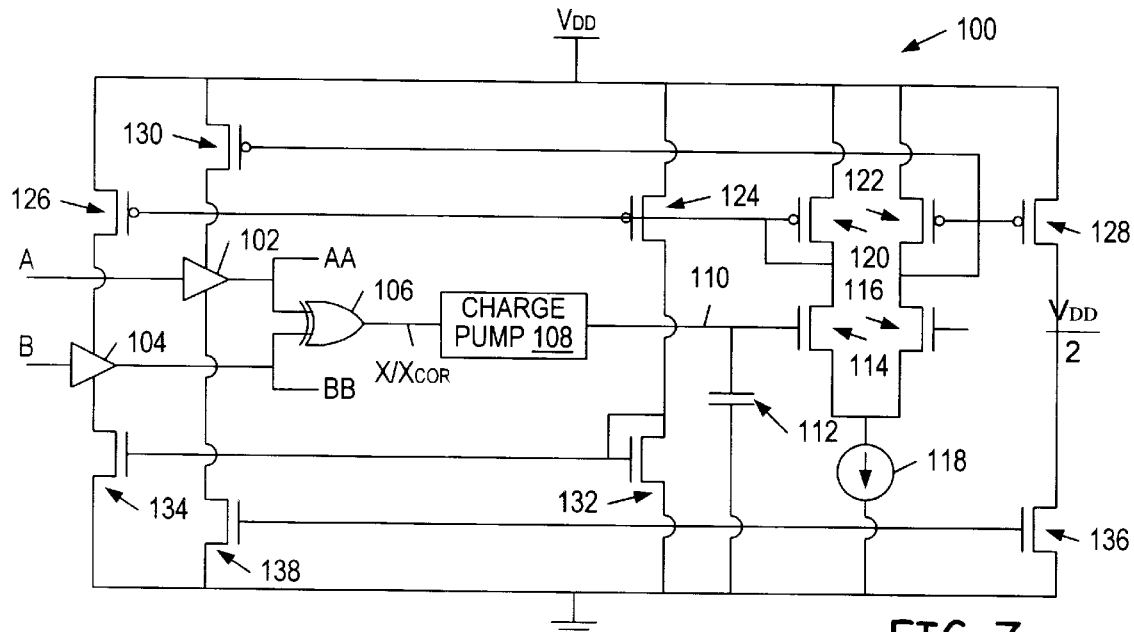
FIG. 7 is a circuit diagram of a clock generation circuit, according to a second embodiment, comprising a pair of buffers of modifiable drive strength, a phase difference detector, a charge pump and a differential current source which produces a pair of signals having a ninety degree phase difference.

FIG. 7 illustrates a phase correction circuit 100 according to another embodiment Circuit 100 is similar to circuit 10 (shown in FIG. 1) in many respects, except that dual buffers, dual feedback paths, and differential current paths are provided to control phase shifting of both clocking signals to produce a compensated pair of output clocking signals AA and BB having a 90° phase differential.

Circuit 100 includes a pair of buffers 102 and 104 coupled between first and second input signals A and B, respectively, and first and second signals AA and BB sent to logic gate 106. Logic gate 106, according to one example, can be an exclusive NOR gate, which either directly or indirectly feeds charge pump 108. Based on the integrated, low frequency voltage level produced from logic gate 106, charge pump 108 charges node 110 via storage device 112. The voltage value at node 110 relative to, e.g., $V_{DD}/2$ produces a differential current through transistors 114 and 116. For example, if voltage at node 110 exceeds $V_{DD}/2$, then the current through transistor 114 will be greater than the current through transistor 116. Current source 118 receives the sum total of the differential current through transistors 114 and 116.

Current through transistor 114 will also be presented through transistor 120, while the current through transistor 116 will transfer through transistor 122. Whatever current exists in transistor 120 will be mirrored to transistor 124 and transistor 126. Likewise, whatever current exists within transistor 122 will be mirrored to transistor 128 and 130. Furthermore, the current through transistor 124 will also be mirrored through transistors 132 and 134. The end result is current through transistor 126 which substantially matches the current through transistor 134. Likewise, current within transistor 128 translates through transistor 136 and is mirrored through transistor 138. The end result is current through transistor 130 which substantially matches the current through transistor 138.

Matching current through transistors 126 and 134 assures that the rise times produced by buffer 104 substantially equals the fall times. Likewise, equal currents through transistors 130 and 138 assure the rise and fall rates produced by buffer 102 are substantially equal. Thus, a change in phase occurs from signals A and B to signals AA and BB, rather than a change in duty cycle.

Figure 8:
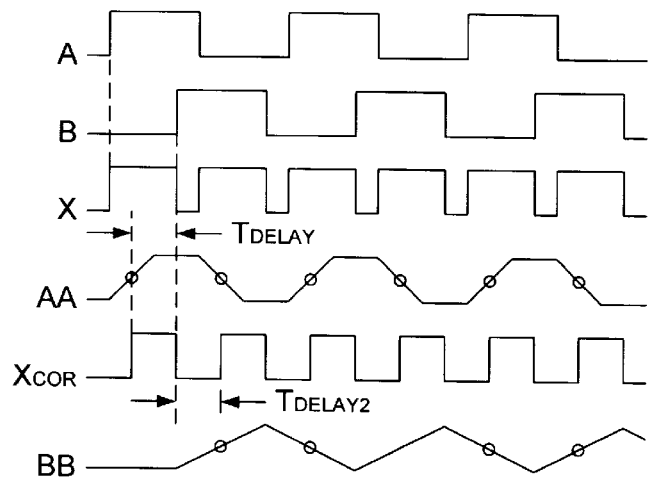
FIG. 8 is a timing diagram of an equal frequency pair of signal before and after which one signal or the other signal of the signal pair is shifted to produce a ninety degree phase differential.

FIG. 8 illustrates a timing diagram of various signals forwarded into an produced from circuit 100. Illustration of circuit 100 operation is best described with reference to the combination of FIGS. 7 and 8. As shown in FIG. 8, if signal B is delayed from signal A by approximately 135°, then it is best that signal A be delayed 45° rather than signal B being delayed 135°. By delaying signal A and enhancing the transitional speed of signal B, circuit 100 achieves the same benefit as circuit 10 but presents a significant correction advantage over circuit 10 (shown in FIG. 1).

FIG. 8 specifically illustrates an output X produced from an exclusive NOR gate into which signals A and B are presented. If the X signal is forwarded to the charge pump, then a voltage increase will occur on node 110. Since the duty cycle of X indicates a larger percentage of logic high values than logic low values, then the voltage at node 110 will exceed $V_{DD}/2$. This results in a larger current through transistor 114 than through transistor 116. The differential current will cause significantly more current through buffer 104 than through buffer 102, resulting in faster rise and fall times output from buffer 104 than from buffer 102. As an approximation, the fast rise and fall times present substantially vertical (i.e., fast) transitional edges on signal BB, yet slope transitional edges on signal AA. The sloped edges on signal AA are shown in FIG. 8 indicating a contrast to the sharp edges of signal A input to the weaker driven buffer 102. The time delay between signal A and signal AA is shown as $T_{DELAY}$. FIG. 8 assumes an insignificant delay between signal B and signal BB, so that the comparison between signal AA and signal BB produces a 50% duty cycle of the corrected output (X cor) produced from logic gate 106.

Merely as a reference point, FIG. 8 further illustrates what would happen if signal A is maintained but signal B is delayed (i.e., delayed by an amount $T_{DELAY2}$) using a single buffer on signal B rather than having a buffer on signal A. Thus, if dual buffers are not used, and circuit 10 (shown in FIG. 1) is all that is available, then signal BB is shown delayed from signal B so as to produce the corrected output (X cor) from logic gate 106. Delaying signal B to achieve 90° phase differential requires significantly larger delay of that signal than if signal A for the exemplary input signals A and B shown in FIG. 8. Accordingly, circuit 100 (shown in FIG. 7) presents an advantage over circuit 10 (shown in FIG. 1).

Figure 9:
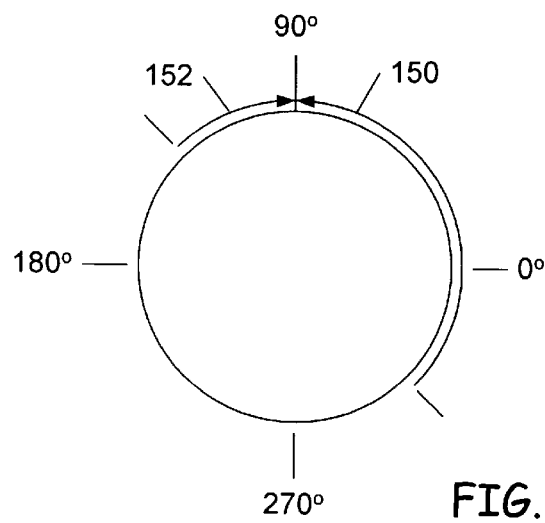
FIG. 9 is phase diagram of a phase requirement between signals of the signal pair before and after phase of one signal is shifted in one direction or phase of another signal is shifted in another direction to achieve ninety degree phase difference, according to the circuit of FIG. 7.

FIG. 9 further illustrates the options of delaying signal A or delaying signal B, with respect to signals A and B shown in FIG. 8. If signal B is delayed to achieve a 90° differential, then the amount of delay is approximately 135° as shown by arrow 150. However, if signal A is delayed, then the amount of delay is only 45°, as shown by arrow 152. In the example in which signal B is delayed more than 90° from signal A, then it is preferably to delay signal A and not signal B for the reasons shown in FIG. 9. Accordingly, a circuit which has dual buffers is preferable since one cannot predict which signal will be delayed from the other.

It will be appreciated to those skilled in the art having the benefit of this disclosure that this invention is believed applicable to any pair of signals which transition at the same rate. Whether a single ended or differential compensation mechanism is used, the result is the same: to shift both rising and falling transitional edges of one or both signals relative to each other so as to provide a 90° phase difference between signals produced from the incoming signals. The signals being produced arise from one or two buffers which modify both the rise and fall rates of the signals forwarded to the single or dual buffers. Accordingly, the specification and drawings are to be regarded in an illustrative rather than a restrictive sense as to possibly numerous variations which fall within the spirit and scope of the present invention.

What is claimed is:

1. A circuit, comprising:

a buffer;

a logic gate coupled to receive a first signal, and to further receive a second signal output from the buffer;

a storage device coupled to store an accumulation of voltage output from the logic gate dependent upon phase differences between the first and second signals; and a feedback path operably coupled from the storage device to the buffer for delaying the second signal from the buffer in proportion to a stored voltage.

2. The circuit as recited in claim 1, further comprising a charge pump coupled between the logic gate and the storage device for accumulating said voltage upon the storage device.

3. The circuit as recited in claim 2, wherein said storage device comprises a capacitor coupled between an output of the charge pump and a ground supply.

4. The circuit as recited in claim 1, wherein said feedback path comprises:

a first current path through which current is modulated in proportion to the stored voltage; and a second current path through which current is mirrored from the first current path.

5. The circuit as recited in claim 4, wherein said buffer is coupled to a power supply via said second current path.

6. The circuit as recited in claim 4, further comprising a third current path through which current is mirrored from the first current path.

7. The circuit as recited in claim 6, wherein said buffer is coupled to a power supply via said second current path and is coupled to a ground supply via said third current path.

8. The circuit as recited in claim 7, wherein delay of the second signal is increased by decreasing current through the second or third current paths.

9. The circuit as recited in claim 1, wherein the first and second signal are of substantially equal frequency, and wherein the second signal is delayed by approximately a 90 degree phase difference relative to the first signal.

10. The circuit as recited in claim 1, wherein the second signal is delayed if the stored voltage is dissimilar from a midscale voltage between a power supply voltage and ground.

11. The circuit as recited in claim 1, wherein the feedback path comprises a transistor connected between a power supply and the buffer.

12. The circuit as recited in claim 11, wherein variation of the stored voltage modulates a current through the transistor, thereby modifying a drive strength of the buffer and causing transitions of the second signal to be offset relative to transitions of the first signal.

13. The circuit as recited in claim 12, wherein a phase difference between the transitions of the first and second signals is approximately 90 degrees.

14. The circuit as recited in claim 13, wherein said modifying the drive strength of the buffer comprises increasing a drive strength of the buffer to decrease rise and fall times of the transitions of the second signal to achieve the 90 degree phase difference from the transitions of the first signal.

15. The circuit as recited in claim 13, wherein said modifying the drive strength of the buffer comprises decreasing a drive strength of the buffer to increase rise and fall times of the transitions of the second signal to achieve the 90 degree phase difference from the transitions of the first signal.

16. The circuit as recited in claim 11, further comprising:

an additional buffer from which the first signal is output; and an additional transistor connected between the power supply and the additional buffer.

17. The circuit as recited in claim 16, wherein variation of the stored voltage modulates a current through the additional transistor, thereby modifying a drive strength of the additional buffer and cause transitions of the first signal to be offset relative to transitions of the second signal.

18. The circuit as recited in claim 17, wherein an offset between the transitions of the first and second signals is approximately 90 degrees.

19. The circuit as recited in claim 1, further comprising an additional buffer from which the first signal is output.

* * * * *